United States Patent [19]

Debaisieux et al.

[11] Patent Number: 4,686,324
[45] Date of Patent: Aug. 11, 1987

[54] COLD-SEAL PACKAGE FOR WITHSTANDING HIGH TEMPERATURES

[75] Inventors: André Debaisieux, Maison Laffitte; Jean P. Aubry, Asnieres, both of France

[73] Assignee: Compagnie d'Electronique et de Piezo-Electricite, Argenteuil, France

[21] Appl. No.: 758,542

[22] Filed: Jul. 24, 1985

[30] Foreign Application Priority Data

Jul. 27, 1984 [FR] France .................... 84 11969

[51] Int. Cl.⁴ ............................................. H05K 5/06
[52] U.S. Cl. ............................... 174/17.05; 174/52 H; 310/348; 357/74
[58] Field of Search .................. 174/52 H, 17.05; 310/313 D, 340, 348; 357/74; 335/202

[56] References Cited

U.S. PATENT DOCUMENTS

| | | | |
|---|---|---|---|
| 2,301,269 | 11/1942 | Gerber | 310/355 |
| 3,828,210 | 8/1974 | Livenick et al. | 174/52 H X |
| 3,988,825 | 11/1976 | Fuchs et al. | 174/52 H X |
| 4,338,486 | 7/1982 | Mucke et al. | 174/52 H X |
| 4,453,104 | 6/1984 | Rapps et al. | 310/348 |

FOREIGN PATENT DOCUMENTS

| | | |
|---|---|---|
| 0018250 | 10/1980 | European Pat. Off. |
| 2239685 | 3/1973 | Fed. Rep. of Germany |
| 1113719 | 12/1955 | France |
| 1347121 | 11/1963 | France |

Primary Examiner—Arthur T. Grimley
Assistant Examiner—David A. Tone
Attorney, Agent, or Firm—Oblon, Fisher, Spivak, McClelland & Maier

[57] ABSTRACT

A cold-seal package affording resistance to high temperatures, comprising a base and a cover provided with an annular flange and so designed as to be brought into contact with each other in such a manner as to permit cold-sealing and encapsulation of an element to be protected. The base comprises a cup and a metallic mounting-plate, connector-pins being rigidly fixed to the mounting-plate and insulated with respect to this latter. The package is a vacuum-tight case comprising at least two columns located within the cover and rigidly fixed to the mounting-plate in order to suspend the element to be protected, and a ground pin brazed to the cup.

12 Claims, 5 Drawing Figures

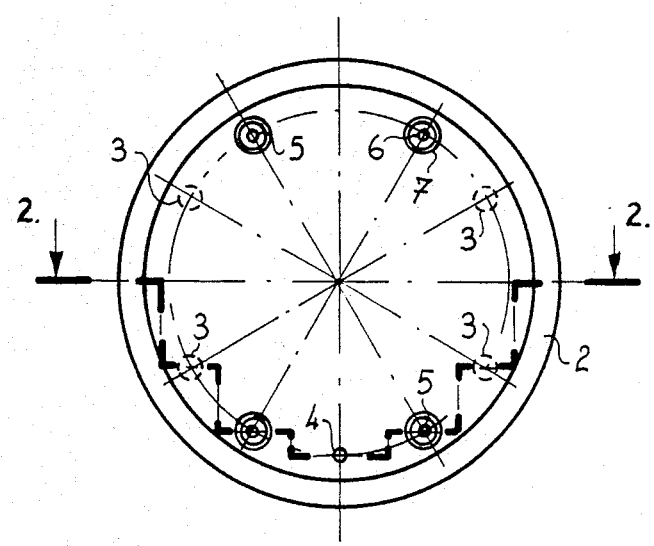
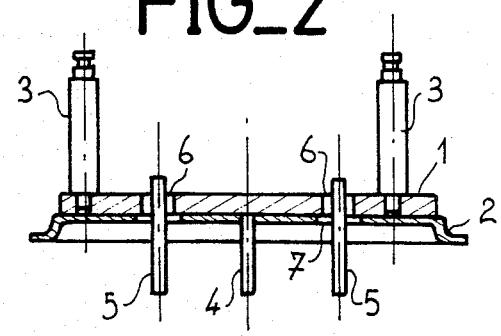
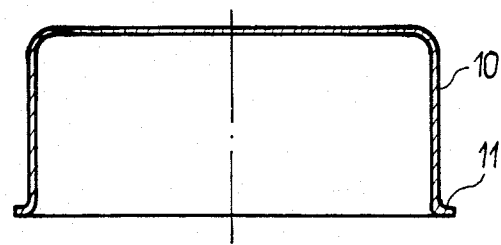

FIG_4
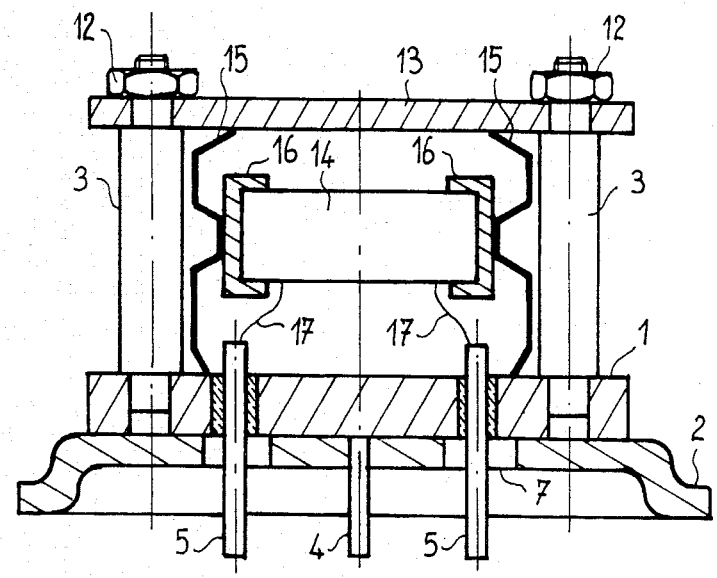
FIG_5
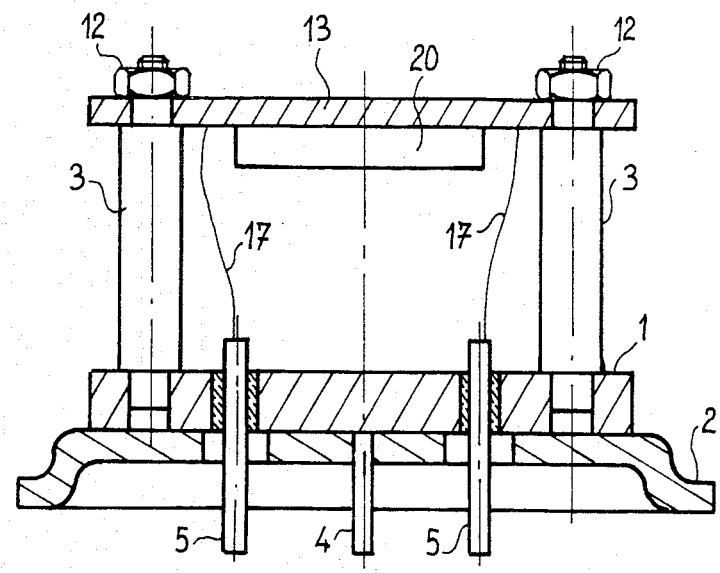

COLD-SEAL PACKAGE FOR WITHSTANDING HIGH TEMPERATURES

BACKGROUND OF THE INVENTION

1. Field of the Invention

The present invention relates to the field of technology which is known as encapsulation. This concept relates to the protection of devices such as, for example, solid-state integrated circuits, electromechanical relays, piezoelectric resonators against the various causes of degradation resulting from the environment.

2. Description of the Prior Art

Two main causes of degradation are observed in practice, one cause being related to such phenomena as chemical corrosion, oxidation by atmospheric oxygen, acid or basic atmospheres, salty air, and the other cause being related to water vapor.

In all cases, the solution to the problem is obtained by enclosing the device to be protected within a leak-tight case which is usually designated as a package.

Furthermore, since the choice of the internal gas atmosphere can be freely determined, the package may accordingly be filled with a chemically neutral gas such as nitrogen, helium, or a helium-neon mixture. In certain applications such as electron tubes, for example, it is even possible to produce a high vacuum of the order of $10^{-6}$ mm of mercury.

For the practical construction of packages, either a metal or a glass has been employed up to the present time. In either case, a package has been formed by assembling and welding a cover on a base after the device to be encapsulated has been fixed on the base.

However, it has been found that, during utilization of the device which has thus been encapsulated, the composition of the internal atmosphere varies with time while impurities such as traces of ambient air as well as water vapor which remain after closure are progressively released into the external atmosphere. These impurities are retained on the internal face of a package as a result of absorption and adsorption phenomena in proportions which are much higher in the case of metal surfaces than in the case of glass surfaces, for example.

In practice, in spite of the advantages offered by glass packages, the most widespread industrial practice consists in utilizing packages of metal having good weldability such as copper or steel and coated with a layer of metals which do not readily oxidize such as nickel, gold or a succession of the two, or the alloy of copper, nickel and zinc known as German silver in which the proportion of zinc has been maintained at a low value.

In comparison with devices of the prior art, the package in accordance with the invention offers many advantages including in particular:

the advantage of resistance to high temperatures;

the advantage of being sealed by the so-called cold welding process which does not produce any stress at the time of welding.

SUMMARY OF THE INVENTION

The invention relates to a cold-seal package affording resistance to high temperatures and comprising an element to be protected, a base and a cover provided with an annular flange and so designed as to be brought into contact with each other in such a manner as to permit cold-sealing and encapsulation of said element. The base is provided with at least two bores into which pins are inserted in order to establish electrical connections with said element, said base being constituted by a cup and a metallic mounting-plate, the connector-pins being rigidly fixed to said mounting-plate and insulated with respect to this latter. The package in accordance with the invention is a vacuum-tight case comprising at least two columns located within the cover and rigidly fixed to said mounting-plate in order to suspend said element, and a ground pin brazed to said cup.

BRIEF DESCRIPTION OF THE DRAWINGS

Other features of the invention will be more more apparent upon consideration of the following description and accompanying drawings, wherein:

FIG. 1 is a bottom view of a package in accordance with the invention;

FIG. 2 is a sectional view of the package in accordance with the invention;

FIG. 3 illustrates an element of the package in accordance with the invention;

FIGS. 4 and 5 illustrate two examples of construction of the package in accordance with the invention.

DESCRIPTION OF THE PREFERRED EMBODIMENTS

The invention is therefore illustrated in FIGS. 1 and 2, in which FIG. 1 is a bottom view of the package and FIG. 2 is a sectional view taken along line 2—2 of FIG. 1.

The package in accordance with the invention comprises a base and a cover 10.

Said base is constituted by:

a die-stamped cup 2;

a metallic mounting-plate 1.

The cup 2 and the mounting-plate 1 are joined together by brazing or any other method for obtaining a high-quality bond.

Holes are then drilled in the assembly thus formed in order to receive pins 5 for establishing electrical connections.

Electrical insulation is ensured for example by means of glass beads 6 inset in the hot state or by means of any other insulating material which is bonded in position by any suitable method. Coating with glass is performed in the mounting-plate 1.

It is also possible to form a glass coating on the entire internal surface of the cup 2.

As shown in FIG. 2, the connections 5 are thus provided in the form of pins, each pin being held in position by means of a lead-through bushing insulator 6, a glass bead being conventionally employed for this purpose.

Each connector-pin 5 has a portion which projects outside the package as well as a portion which projects inside the package for the purpose of soldering a lead-wire from the circuit or circuits to be provided within the package.

Although the exact number can be variable, provision is made for at least two electrical connections.

There are placed in the metallic mounting-plate 1 at least two metallic columns 3 for performing various functions according to the intended use of the package and in particular for permitting suspension of the internal element of the package which can be a resonator, for example.

The bond between column 3 and mounting-plate 1 is formed by brazing or any other method.

The cover 10 shown in FIG. 3 is obtained by die-stamping or by any other suitable method.

Said cover 10 has a metallic annular flange 11 of variable size.

The thickness of the material employed is a function of the dimensions of the cover 10 and of the conditions of use.

Sealing of the cover 10 to the base can be performed by cold welding, electric welding or any other process for ensuring perfect containment of a vacuum below or equal to $10^{-6}$ Torr.

The assembly must be capable of affording resistance to substantial temperature variations, the materials being necessarily chosen with a view to withstanding temperatures of at least 300° C.

Thus the package in accordance with the invention is provided with glass beads 6 which are set in the metallic mounting-plate 1 and not in the closure cup 2. Said beads correspond in number to the connecting-lugs or pins 5.

The package also comprises at least two columns 3.

By way of example, the package is sealed by means of a cold welding process performed between the annular flanges which are provided on the cup 2 and on the cover 10. It is recalled that the cold-welding process consists of cold-state compression of two metals by creep deformation and therefore by interpenetration of the molecules of these two materials, thus making it possible to obtain a highly effective vacuum-tight seal. Moreover, this type of sealing operation does not permit opening without destruction of the package. The mounting-plate is brazed to the cup.

The glass beads 6 are cast within the mounting-plate. The package in accordance with the invention is capable of operating at temperatures such as 420° C., 430° C., without resulting in detachment of these glass inserts at the level of the mounting-plate. With this objective, the type of glass employed and the material of the mounting-plate are chosen so as to have closely related coefficients of expansion in respect of temperatures which vary between 0° and 450° C.

By way of example, said package is sealed within a vacuum enclosure at a temperature which is higher than room temperature, thus making it possible to improve the vacuum by getter effect at the time of subsequent cooling. Furthermore, there is no longer any need for a pumping tube which would result in degradation of the vacuum within the package.

Referring now to the embodiments illustrated in FIGS. 4 and 5, the package in accordance with the invention is therefore seen to comprise a cup 2 and a cover 10, as well as at least one mounting-plate 1 placed at the lower end of the package. However, provision can also be made for an upper mounting-plate 13 which is rigidly fixed to metallic columns 3, for example by fastening means 12. Said upper mounting-plate serves to support a hybrid electronic circuit 20, for example, or permits the suspension of a resonator 14 by means of springs 15. This resonator can be a quartz crystal unit of the "improved aging" type or of the "self-suspended" type. Said resonator is provided in addition with a ground output 4 which is brazed in the cup but the position of which is unimportant.

Consideration may thus be given to a pitch of the different connector-pins of the package in such a manner as to ensure that this latter is compatible with a printed-circuit package, thereby providing the possibility of direct connection.

The mounting-plate 1 has greater rigidity than the brazed cup 2, thus preventing the appearance of any stress at the level of the mounting-plate 1 at the time of closure of the package.

The package can contain an electronic circuit 20 fabricated, for example, in accordance with the hybrid technology. This circuit can consist, for example, of a complete oscillator encapsulated under vacuum, thus making it possible to obtain a reduction in power consumption. In such a case, the oscillator comprises a quartz crystal which may or may not be encapsulated.

By way of example, the cover 10 can be fabricated from nickel, nickel-copper alloy, treated aluminum or any other material which is capable of accepting a vacuum-tight seal formed by the cold welding process.

The base therefore comprises a cup 2 of material which is similar to that of the cover in order to permit vacuum-tight closure by cold welding, and a mounting-plate 1 which can be of steel (such as stainless steel or special steels, for example) or of any other material having a coefficient of expansion which is close to that of the glass beads 6 over a very broad temperature range.

By the term "special steels" is meant a steel to which elements not present in carbon steel have been added, or in which the content of manganese or silicon is increased above that in carbon steels. (See Dictionary of Science and Technology, W. & R. Chambers Ltd., London, 1971, page 33).

The brazed joint between the mounting-plate 1 and the cup 2 is formed at high temperature, thus permitting operation at temperatures above 450° C.

The glass beads 6 can consist of a so-called "Diuver" ferro-nickel bond, or of molybdenum glass, or of 740 glass, for example, or of any compatible materials which afford resistance up to temperatures in the vicinity of 540° C.

In order to prevent the occurrence of a natural strain-hardening effect in the course of time, that is, in order to prevent surface hardening of the material which would give rise to the appearance of microcracks over a period of time as a result of the sealing operation and at the points which are in contact, a pure gold deposit is formed at the surface, thus protecting the package against any chemical attack.

The vacuum obtainable within the package is below the value of $10^{-7}$ Torr with outgassing at a temperature which is higher than 350° C.

After producing the vacuum within the package, said package can then be filled with a neutral gas such as helium, for example, thus making it possible to improve the thermal parameters, or with a gas of "electronic purity" such as silane, for example, which is a combination of neutral gases.

The package in accordance with the invention thus offers many advantages including in particular:

resistance to high temperatures;

cold-state sealing by the cold welding process, with the result that no stress is exerted at the level of the mounting-plate.

What is claimed is:

1. A cold-seal package affording resistance to high temperatures and comprising an element to be protected, a base and a cover provided with an annular flange and so designed as to be brought into contact with each other in such a manner as to permit cold-sealing and encapsulation of said element, the base being provided with at least two bores into which connector pins are inserted in order to establish electrical connections with said element, wherein said base comprises a cup and a metallic mounting-plate, the connector-pins being rigidly fixed to said mounting-plate and insulated with respect to this latter, said package being a vacuum-tight case comprising at least two columns located within the cover and rigidly fixed to said mounting-plate in order to suspend said element, and a ground pin brazed to said cup.

2. A package according to claim 1, wherein the connector-pins are insulated with respect to the mounting-plate by means of glass beads.

3. A package according to claim 1, wherein the cup and the mounting-plate are joined together by brazing.

4. A package according to claim 1, wherein the cup is a die-stamped cup.

5. A package according to claim 1, wherein the material of the mounting-plate and the glass beads have closely related coefficients of expansion in respect of temperatures within the range of 0 to 450° C.

6. A package according to claim 1, wherein the cover is formed of material selected from the group consisting of nickel, nickel-copper alloy, and treated aluminum.

7. A package according to claim 6, wherein the cup is formed of material which is similar to that of the cover.

8. A package according to claim 1, wherein the mounting-plate is formed of material selected from the group consisting of stainless steel or special steels.

9. A package according to claim 1, wherein the glass beads are formed of material selected from "Diuver" ferro-nickel bonding glass, molybdenum glass, 740 glass or any other compatible material.

10. A package according to claim 1, comprising a deposit of pure gold on the surface of said package.

11. A package according to claim 1, containing a neutral gas.

12. A package according to claim 1, containing a combination of neutral gases.

* * * * *